(12) United States Patent
Chi et al.

(10) Patent No.: US 8,901,755 B2
(45) Date of Patent: Dec. 2, 2014

(54) SEMICONDUCTOR DEVICE AND METHOD OF FORMING CONDUCTIVE LAYER OVER METAL SUBSTRATE FOR ELECTRICAL INTERCONNECT OF SEMICONDUCTOR DIE

(75) Inventors: HeeJo Chi, Kyoungki-do (KR); Namju Cho, Gyeonggi-do (KR); HanGil Shin, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 23 days.

(21) Appl. No.: 13/425,349

(22) Filed: Mar. 20, 2012

(65) Prior Publication Data

US 2013/0249104 A1 Sep. 26, 2013

(51) Int. Cl.
*H01L 23/28* (2006.01)
*H01L 21/00* (2006.01)

(52) U.S. Cl.
USPC ........... 257/787; 257/686; 257/687; 257/666; 438/121; 438/122; 438/123; 438/127; 438/109

(58) Field of Classification Search
CPC ................. H01L 2224/80; H01L 2224/80001; H01L 2224/80003; H01L 2224/81001
USPC .......... 438/121, 122, 127, 123, 109; 257/686, 257/687, 787, 666–678
See application file for complete search history.

(56) References Cited

U.S. PATENT DOCUMENTS

| | | | | |
|---|---|---|---|---|
| 5,151,769 A * | 9/1992 | Immorlica et al. | ............ | 257/659 |
| 5,309,026 A * | 5/1994 | Matsumoto | .................... | 257/787 |
| 5,353,498 A * | 10/1994 | Fillion et al. | .................... | 29/840 |
| 5,841,193 A * | 11/1998 | Eichelberger | .................. | 257/723 |
| 6,025,250 A * | 2/2000 | Ha et al. | ........................ | 438/459 |
| 6,271,469 B1 * | 8/2001 | Ma et al. | ........................ | 174/521 |
| 6,316,829 B1 * | 11/2001 | Boon et al. | ..................... | 257/730 |
| 6,339,251 B2 * | 1/2002 | Ha et al. | ........................ | 257/620 |
| 6,396,148 B1 * | 5/2002 | Eichelberger et al. | ........ | 257/758 |
| 6,423,570 B1 * | 7/2002 | Ma et al. | ....................... | 438/106 |
| 6,586,822 B1 * | 7/2003 | Vu et al. | ........................ | 257/678 |
| 6,586,836 B1 * | 7/2003 | Ma et al. | ....................... | 257/723 |
| 6,621,147 B2 * | 9/2003 | Ball | .............................. | 257/622 |
| 6,709,897 B2 | 3/2004 | Cheng et al. | | |
| 6,709,898 B1 * | 3/2004 | Ma et al. | ....................... | 438/122 |
| 6,713,859 B1 * | 3/2004 | Ma | ............................... | 257/687 |
| 6,734,534 B1 * | 5/2004 | Vu et al. | ....................... | 257/668 |
| 6,902,950 B2 * | 6/2005 | Ma et al. | ....................... | 438/106 |
| 6,964,889 B2 * | 11/2005 | Ma et al. | ....................... | 438/127 |
| 7,087,991 B2 | 8/2006 | Chen et al. | | |
| 7,112,467 B2 * | 9/2006 | Eichelberger et al. | ........ | 438/106 |
| 7,179,683 B2 * | 2/2007 | Low et al. | ..................... | 438/108 |

(Continued)

*Primary Examiner* — David Zarneke
(74) *Attorney, Agent, or Firm* — Robert D. Atkins; Patent Law Group: Atkins and Associates, P.C.

(57) ABSTRACT

A semiconductor device has a substrate with a cavity. A conductive layer is formed within the cavity and over the substrate outside the cavity. A plurality of indentations can be formed in a surface of the substrate opposite the cavity for stress relief. A first semiconductor die is mounted within the cavity. A plurality of conductive vias can be formed through the first semiconductor die. An insulating layer is disposed between the first semiconductor die and substrate with the first conductive layer embedded within the first insulating layer. An encapsulant is deposited over the first semiconductor die and substrate. An interconnect structure is formed over the encapsulant. The interconnect structure is electrically connected to the first semiconductor die and first conductive layer. The substrate is removed to expose the first conductive layer. A second semiconductor die is mounted to the conductive layer over the first semiconductor die.

25 Claims, 9 Drawing Sheets

(56) References Cited

U.S. PATENT DOCUMENTS

| | | | |
|---|---|---|---|
| 7,242,092 B2 * | 7/2007 | Hsu | 257/723 |
| 7,442,581 B2 * | 10/2008 | Lytle et al. | 438/118 |
| 7,619,901 B2 * | 11/2009 | Eichelberger et al. | 361/763 |
| 7,993,941 B2 * | 8/2011 | Huang et al. | 438/15 |
| 8,207,020 B2 * | 6/2012 | Ino et al. | 438/122 |
| 8,225,499 B2 * | 7/2012 | Tuominen et al. | 29/829 |
| 8,319,318 B2 * | 11/2012 | Nalla et al. | 257/660 |
| 8,334,590 B1 * | 12/2012 | Jung et al. | 257/698 |
| 8,354,746 B2 * | 1/2013 | Huang et al. | 257/690 |
| 8,357,564 B2 * | 1/2013 | Chi et al. | 438/108 |
| 8,378,476 B2 * | 2/2013 | Lee et al. | 257/686 |
| 8,384,227 B2 * | 2/2013 | Cho et al. | 257/778 |
| 8,432,022 B1 * | 4/2013 | Huemoeller et al. | 257/659 |
| 8,617,935 B2 * | 12/2013 | Xu et al. | 438/127 |
| 8,669,655 B2 * | 3/2014 | Geitner et al. | 257/692 |
| 2006/0125080 A1 * | 6/2006 | Hsu | 257/693 |
| 2007/0210423 A1 * | 9/2007 | Hsu | 257/668 |
| 2008/0296759 A1 * | 12/2008 | Ramakrishna et al. | 257/737 |
| 2010/0140771 A1 * | 6/2010 | Huang et al. | 257/686 |
| 2011/0062578 A1 * | 3/2011 | Katagiri et al. | 257/712 |
| 2011/0095416 A1 * | 4/2011 | Sarihan | 257/692 |
| 2011/0156231 A1 * | 6/2011 | Guzek | 257/686 |
| 2011/0215450 A1 | 9/2011 | Chi et al. | |
| 2011/0278707 A1 | 11/2011 | Chi et al. | |
| 2011/0316140 A1 * | 12/2011 | Nalla et al. | 257/698 |
| 2012/0086117 A1 * | 4/2012 | Chang et al. | 257/706 |
| 2012/0231584 A1 * | 9/2012 | Kawahara | 438/122 |
| 2013/0045571 A1 * | 2/2013 | Chen et al. | 438/121 |
| 2013/0049182 A1 * | 2/2013 | Gong et al. | 257/676 |
| 2013/0056861 A1 * | 3/2013 | Gao et al. | 257/675 |
| 2013/0075924 A1 * | 3/2013 | Lin et al. | 257/774 |
| 2013/0127029 A1 * | 5/2013 | Lee et al. | 257/675 |
| 2013/0241042 A1 * | 9/2013 | Kwon | 257/676 |
| 2014/0117537 A1 * | 5/2014 | Lin et al. | 257/737 |

* cited by examiner

SEMICONDUCTOR DEVICE AND METHOD OF FORMING CONDUCTIVE LAYER OVER METAL SUBSTRATE FOR ELECTRICAL INTERCONNECT OF SEMICONDUCTOR DIE

FIELD OF THE INVENTION

The present invention relates in general to semiconductor devices and, more particularly, to a semiconductor device and method of forming a conductive layer over a metal substrate for vertical and horizontal electrical interconnect of a semiconductor die in a Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is mounted to a temporary carrier. An encapsulant is deposited over the semiconductor die and carrier. The carrier is removed and a build-up interconnect structure is formed over the semiconductor die and encapsulant. A plurality of conductive vias can be formed through the encapsulant outside a footprint of the semiconductor die for vertical electrical interconnect through the Fo-WLCSP. The conductive vias require additional processing steps, which add cost to the manufacturing process.

SUMMARY OF THE INVENTION

A need exists for a cost effective vertical and horizontal electrical interconnect in a Fo-WLCSP. Accordingly, in one embodiment, the present invention is a method of making a semiconductor device comprising the steps of providing a substrate having a cavity, forming a first conductive layer within the cavity and over the substrate outside the cavity, providing a first semiconductor die, disposing a first insulating layer between the first semiconductor die and substrate, mounting the first semiconductor die within the cavity with the first conductive layer embedded within the first insulating layer, depositing an encapsulant over the first semiconductor die and substrate, forming an interconnect structure over the encapsulant, and removing the substrate to expose the first conductive layer. The interconnect structure is electrically connected to the first semiconductor die and first conductive layer.

In another embodiment, the present invention is a method of making a semiconductor device comprising the steps of providing a substrate having a cavity, forming a first conductive layer within the cavity and over the substrate outside the cavity, mounting a first semiconductor die within the cavity, depositing an encapsulant over the first semiconductor die and substrate, forming an interconnect structure over the encapsulant, and removing the substrate to expose the first conductive layer. The interconnect structure is electrically connected to the first semiconductor die and first conductive layer.

In another embodiment, the present invention is a method of making a semiconductor device comprising the steps of providing a substrate, forming a first conductive layer over the substrate, mounting a first semiconductor die over the first conductive layer, depositing an encapsulant over the first semiconductor die and substrate, and forming an interconnect structure over the encapsulant. The interconnect structure is electrically connected to the first semiconductor die and first conductive layer.

In another embodiment, the present invention is a semiconductor device comprising a substrate and first conductive layer formed over the substrate. A first semiconductor die is mounted over the first conductive layer. An encapsulant is deposited over the first semiconductor die and substrate. An interconnect structure is formed over the encapsulant. The interconnect structure is electrically connected to the first semiconductor die and first conductive layer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (e.g., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (e.g., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
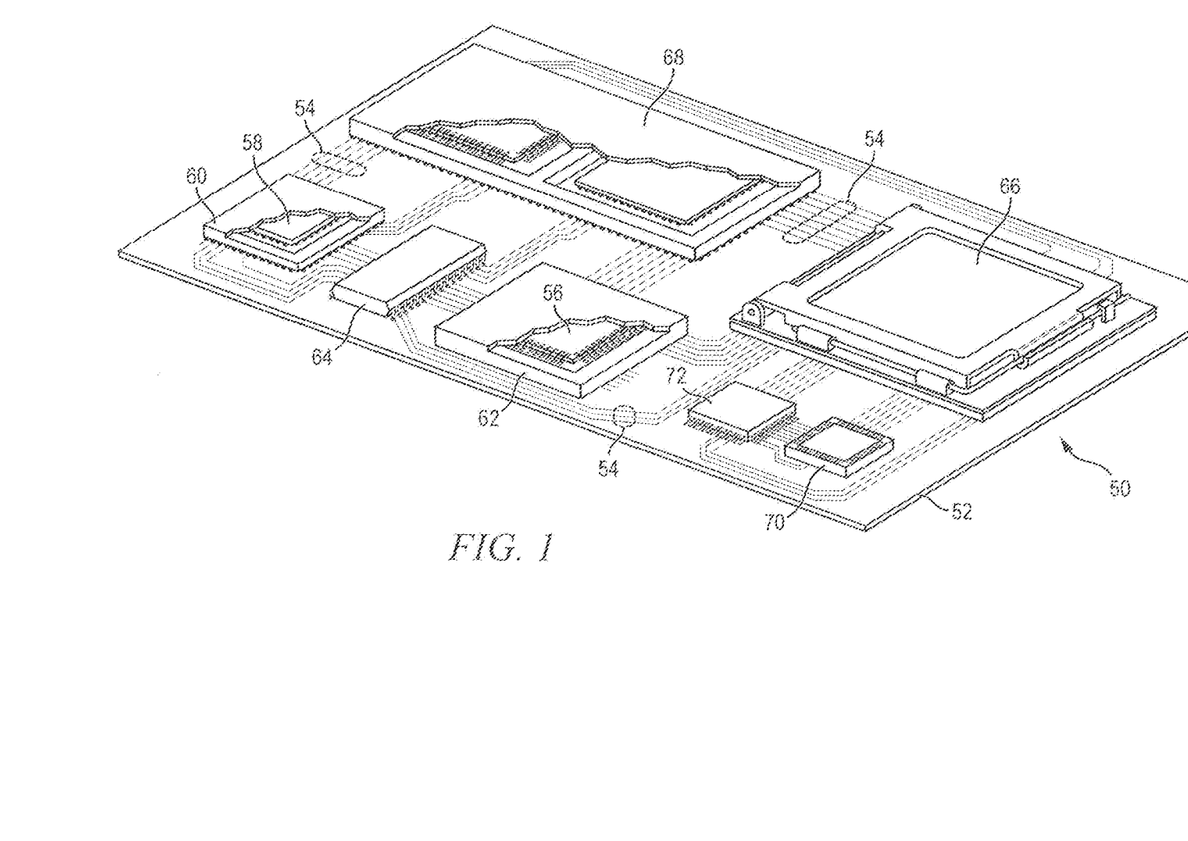
FIG. 1 illustrates a printed circuit board (PCB) with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
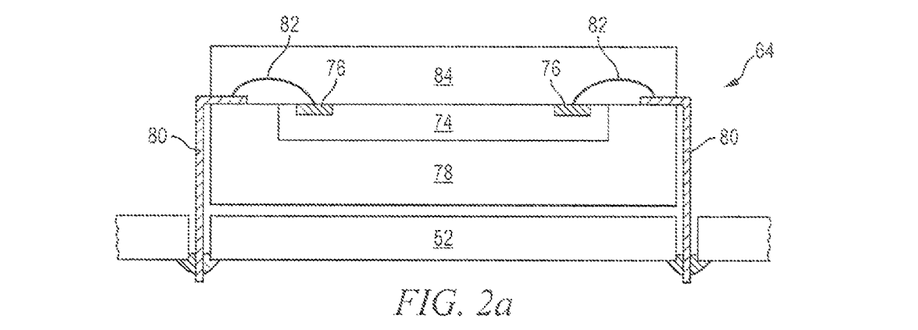
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), silver (Ag), titanium (Ti), tungsten (W), palladium (Pd), or platinum (Pt), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

Figure 2B:
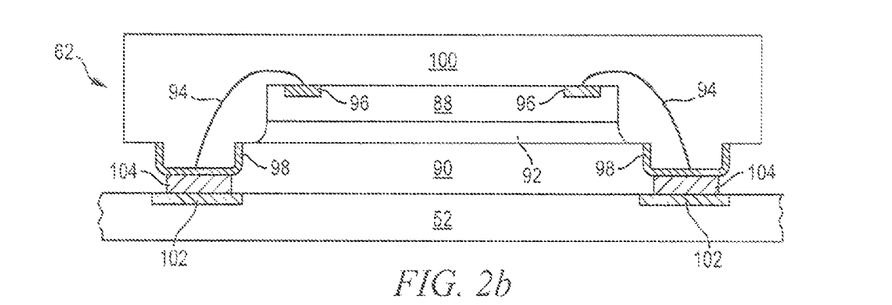

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
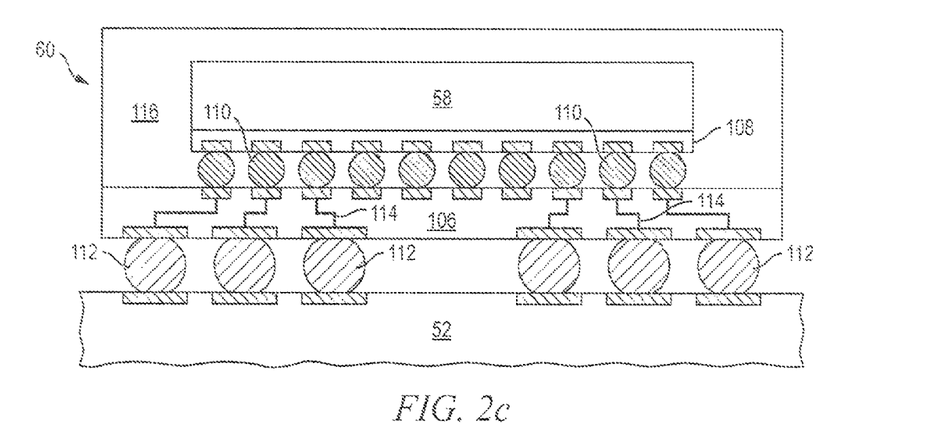

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
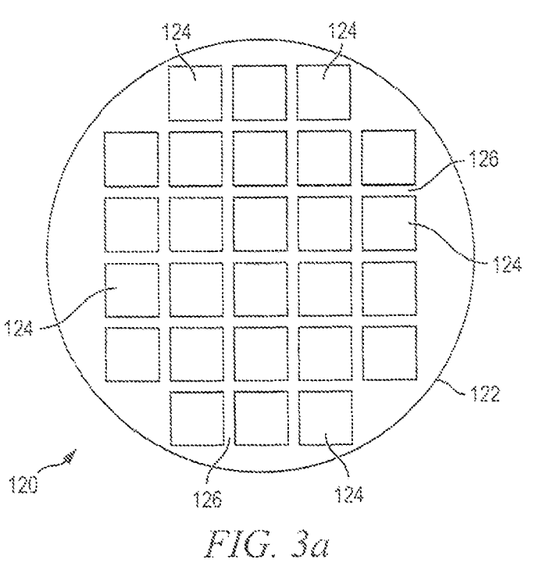
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
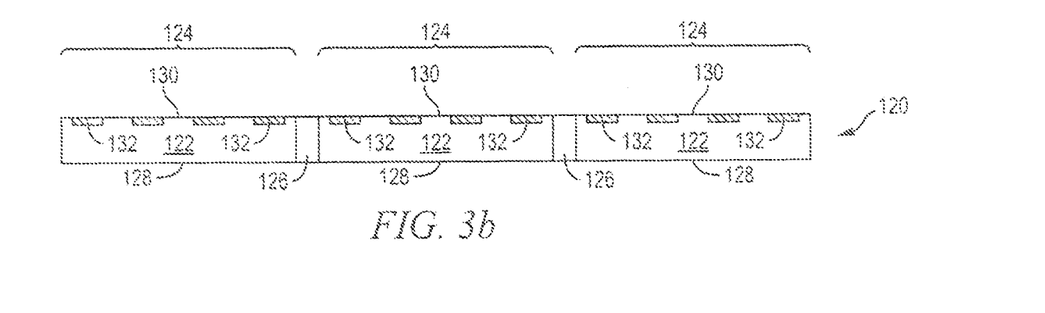

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as a digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, Ti, W, Pd, Pt, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
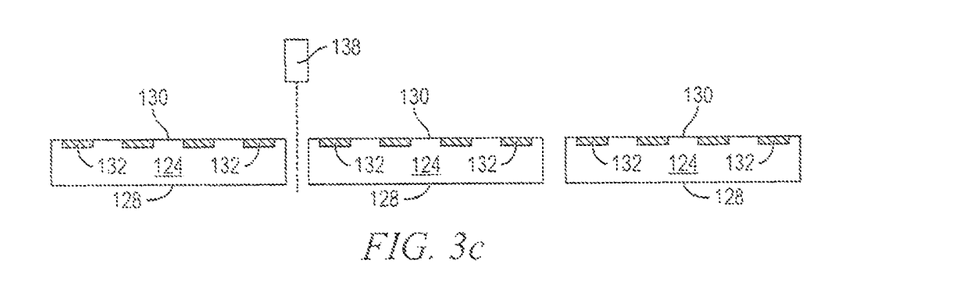

In FIG. 3c, semiconductor wafer 120 is singulated into individual semiconductor die 124 by using a laser 136 to remove material from within saw street 126. Alternatively, singulation of semiconductor wafer 120 can be accomplished using a saw blade or water jet to remove material within saw street 126. In another alternative, semiconductor wafer 120 can be singulated by scribing the semiconductor wafer within the saw street and fracturing the wafer along the scribe lines or by weakening a region of the semiconductor wafer within the saw street and fracturing the weakened region, e.g., by stealth dicing.

Figure 4A:
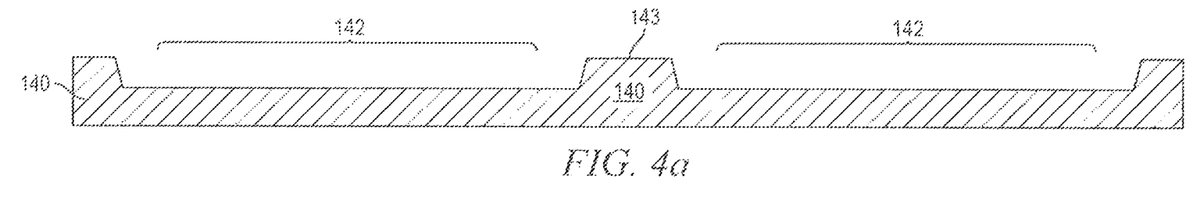
FIGS. 4a-4m illustrate a process of forming a conductive layer over a metal substrate for electrical interconnect of a semiconductor die.

FIGS. 4a-4m illustrate, in relation to FIGS. 1 and 2a-2c, a process of forming a conductive layer over a metal substrate for vertical and horizontal electrical interconnect of a semiconductor die. In FIG. 4a, a substrate or leadframe 140 includes a plurality of cavities 142 extending into the substrate from surface 143. Substrate 140 can be formed from one or more layers of Al, Cu, Sn, Ni, Au, Ag, Ti, W, chromium, iron, manganese, magnesium, rhodium, ruthenium, zinc, or metals alloys. Substrate 140 can be formed by molding, stamping, rolling, sintering, milling, electroplating, welding, and brazing, individually or in combination. Substrate 140 has a thickness of 100-1000 micrometers (μm) and depth of cavities 142 of 10-200 μm.

Figure 4B:
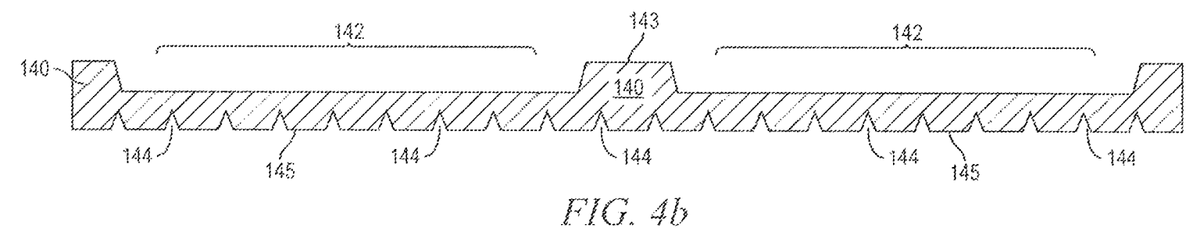

In one embodiment, substrate 140 includes a plurality of grooves, notches, or indentations 144 formed in surface 145, opposite surface 143, as shown in FIG. 4b. Grooves 144 can be formed by molding, stamping, rolling, milling, grinding, drilling, laser ablation, etching, or electrical discharge machining individually or in combination. Grooves 144 reduce warping of substrate 140 during manufacturing, particularly during later formation of the build-up interconnect structure.

Figure 4C:
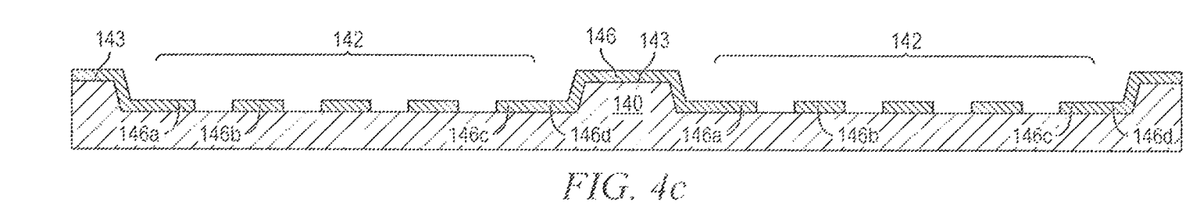
Figure 4D:
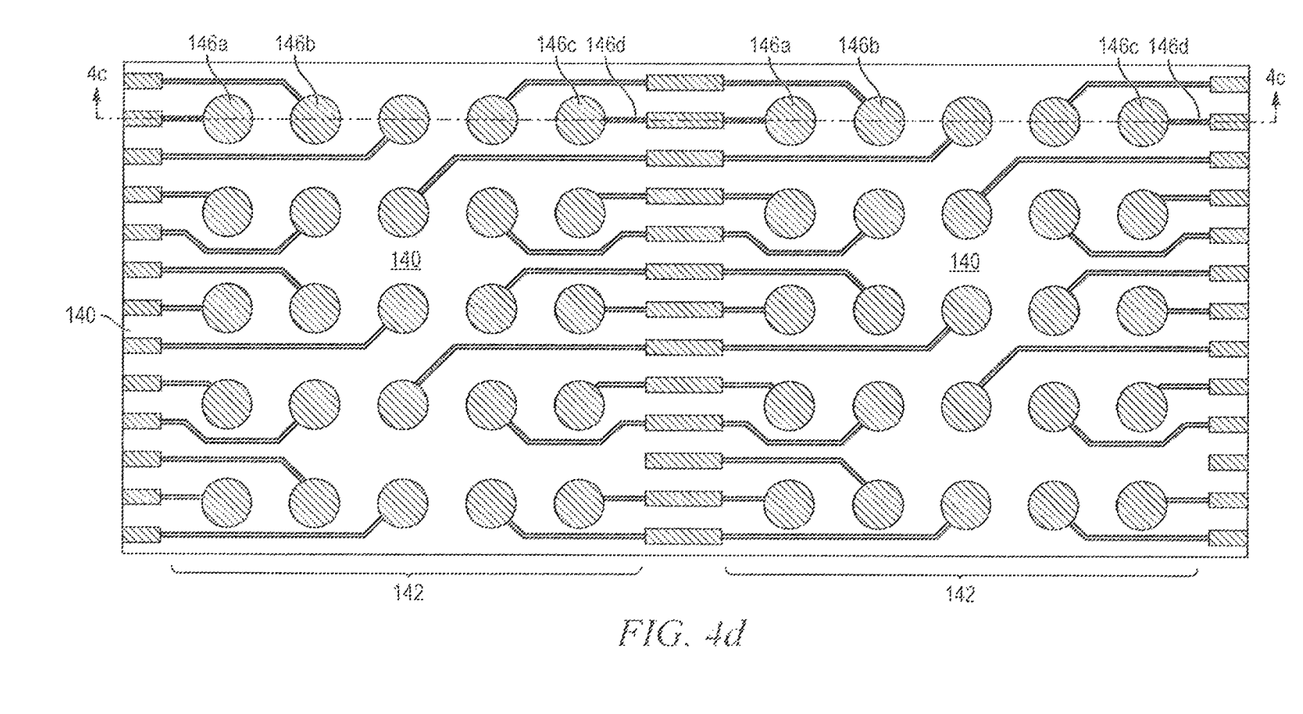

Continuing from FIG. 4a, an electrically conductive layer 146 is conformally applied within cavities 142 and over surface 143 of substrate 140 outside the cavities using a patterning and metal deposition process, such as printing, PVD, CVD, sputtering, electrolytic plating, or electroless plating process, as shown in FIG. 4c. Conductive layer 146 can be one or more layers of Al, Cu, Sn, Ni, Au, Ag, Ti, W, Pd, Pt, iridium, osmium, or other suitable electrically conductive material. Conductive layer 146 follows the contour of substrate 140 within cavities 142 and over surface 143 of substrate 140 outside the cavities. In one embodiment, conductive layer 146 is Cu plated through a photoresist layer. FIG. 4c is a cross-sectional view of substrate 140 and conductive layer 146, taken along line 4c-4c of FIG. 4d. Conductive layer 146 is patterned over substrate 140 as a plurality of contact pads or trace lines for electrical interconnect, as shown in the plan view of FIG. 4d. For example, conductive layer 146a can be formed over substrate 140 and electrically isolated from conductive layer 146b. Contact pad 146c is continuous with conductive trace 146d. Other portions of conductive layer 146 are electrically common or electrically isolated depending on the connectivity of semiconductor die 124. Substrate 140 provides a convenient and useful support base to form conductive layer 146.

Figure 4E:
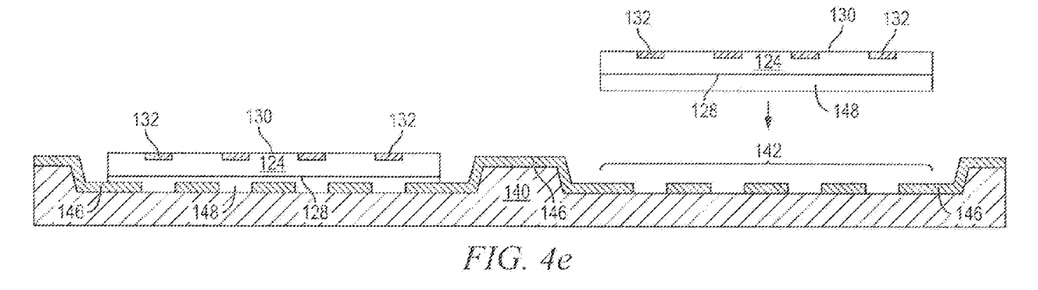
Figure 4F:
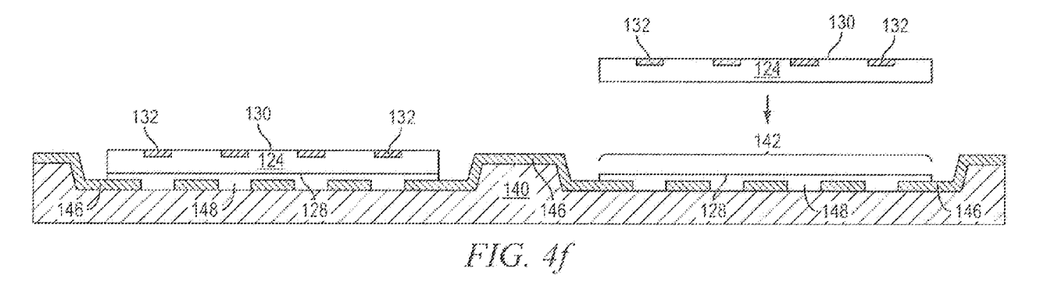

In FIG. 4e, insulating layer or adhesive layer 148 is formed over back surface 128 of semiconductor die 124 from FIGS. 3a-3c using PVD, CVD, laminating, printing, spin coating, spray coating, sintering, or thermal oxidation. Alternatively, insulating layer 148 is formed over substrate 140 and conductive layer 146 within cavities 142 using PVD, CVD, laminating, printing, spin coating, spray coating, sintering, or thermal oxidation, as shown in FIG. 4f. The insulating layer 148 includes one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material. An adhesive layer 148 can be epoxy or polymer.

Figure 4G:
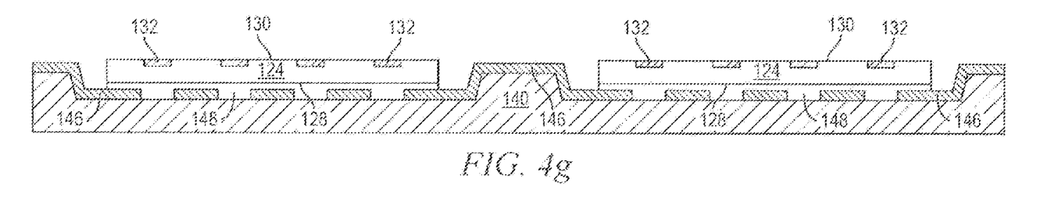

Semiconductor die 124 are positioned over substrate 140 with back surface 128 oriented towards and aligned with cavities 142. Semiconductor die 124 are pressed onto substrate 140 so that insulating layer 148 deforms around conductive layer 146. FIG. 4g shows semiconductor die 124 mounted to substrate 140 within cavities 142 with conductive layer 146 partially embedded within insulating layer 148. The insulating layer 148 can be solidified by curing, baking, cooling, evaporation, UV light, polymerization, or other suitable process.

Figure 4H:
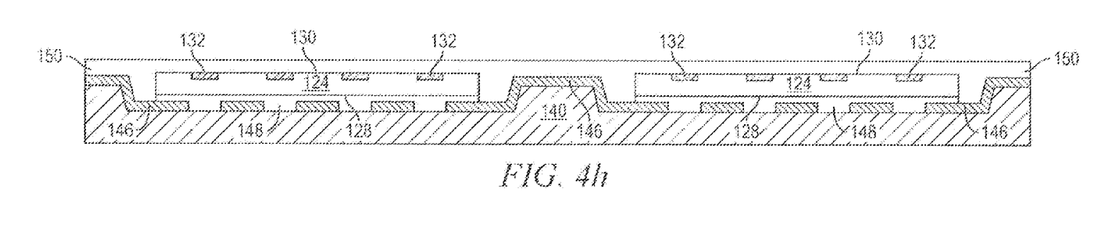

In FIG. 4h, an encapsulant or molding compound 150 is deposited over semiconductor die 124, substrate 140, and conductive layer 146 using a paste printing, compressive molding, transfer molding, liquid encapsulant molding, vacuum lamination, spin coating, or other suitable applicator. Encapsulant 150 can be one or more layers of polymer composite material, such as epoxy resin with filler, epoxy acrylate with filler, or polymer with proper filler. Encapsulant 150 is non-conductive and environmentally protects the semiconductor device from external elements and contaminants. In one embodiment, encapsulant 150 includes transparent or translucent material.

Figure 4I:
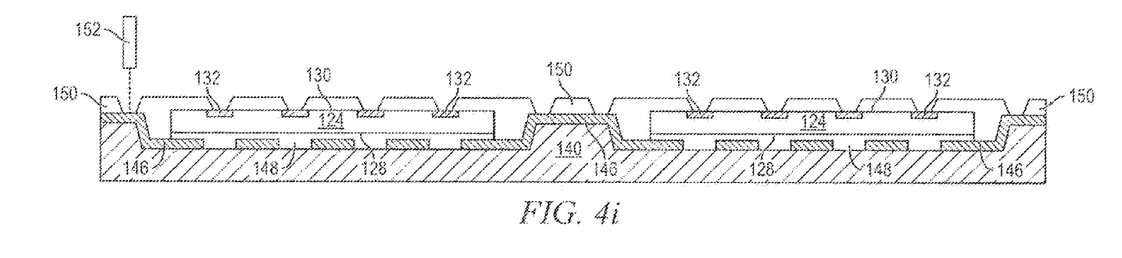

In FIG. 4i, a portion of encapsulant 150 is removed by an etching process through a patterned photoresist layer to expose conductive layers 132 and 146. Alternatively, a portion of encapsulant 150 is removed by laser direct ablation (LDA) using laser 152.

Figure 4J:
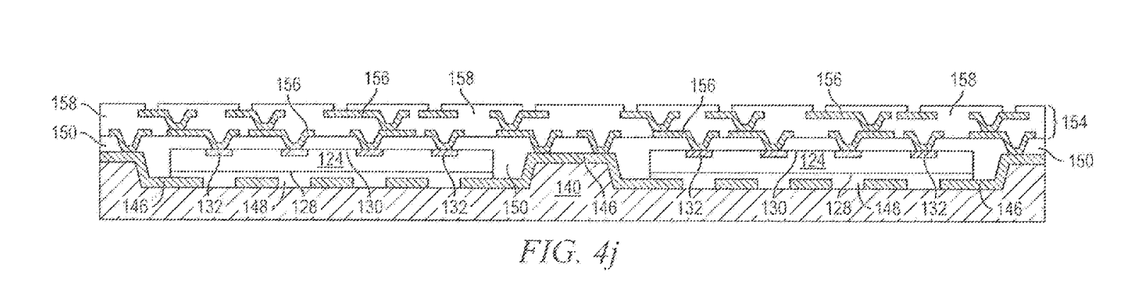

In FIG. 4j, a build-up interconnect structure 154 is formed over encapsulant 150 and conductive layers 132 and 146. The build-up interconnect structure 154 includes an electrically conductive layer or redistribution layer (RDL) 156 formed using a patterning and metal deposition process such as sputtering, electrolytic plating, and electroless plating. Conductive layer 156 can be one or more layers of Al, Cu, Sn, Ni, Au, Ag, or other suitable electrically conductive material. Conductive layer 156 is electrically connected to conductive layers 132 and 146 for routing signals. Other portions of conductive layer 156 can be electrically common or electrically isolated depending on the design and function of semiconductor die 124.

The build-up interconnect structure 154 further includes an insulating or passivation layer 158 formed between conductive layer 156 for electrical isolation using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose conductive layer 156 for bump formation or additional package interconnect.

Figure 4K:
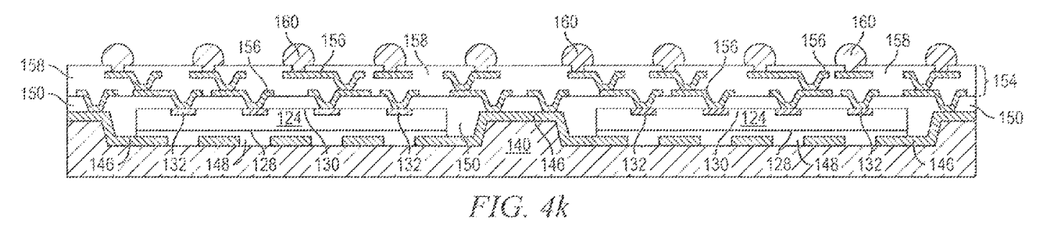

In FIG. 4k, an electrically conductive bump material is deposited over build-up interconnect structure 154 and electrically connected to conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 160. In some applications, bumps 160 are reflowed a second time to improve electrical contact to conductive layer 156. An under bump metallization (UBM) layer can be formed under bumps 160. Bumps 160 can also be compression bonded to conductive layer 156. Bumps 160 represent one type of interconnect structure that can be formed over conductive layer 156. The interconnect structure can also use bond wires, stud bump, micro bump, or other electrical interconnect.

Figure 4L:
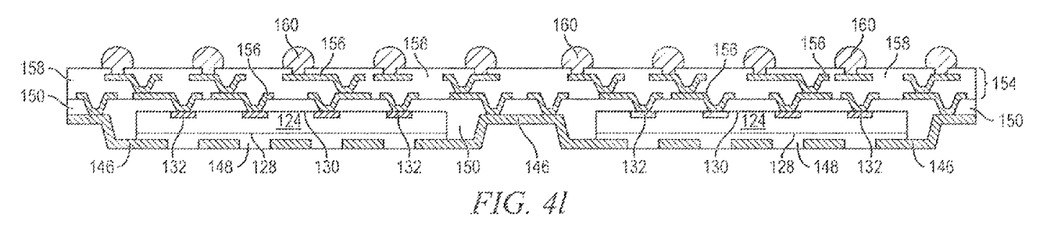

In FIG. 4l, substrate 140 is removed by chemical etching, mechanical peel-off, CMP, mechanical grinding, thermal bake, laser scanning, or wet stripping to expose conductive layer 146 and insulating layer 148.

Figure 4M:
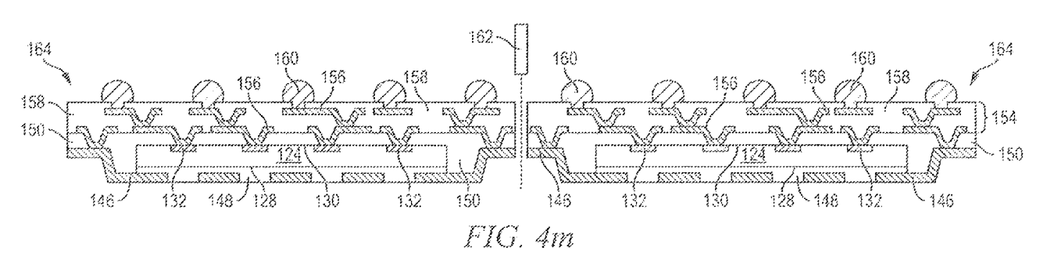

In FIG. 4m, semiconductor die 124 are singulated through build-up interconnect structure 154, encapsulant 150, and conductive layer 146 using a saw blade or laser cutting tool 162 into individual 3D Fo-WLCSP 164.

Figure 5:
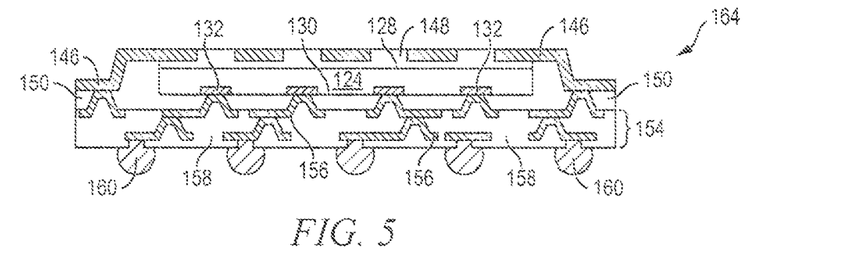
FIG. 5 illustrates a Fo-WLCSP with a conductive layer formed over a metal substrate for vertical and horizontal electrical interconnect.

FIG. 5 shows the 3D Fo-WLCSP 164 after singulation. Semiconductor die 124 is electrically connected to build-up interconnect structure 154 and bumps 160. A conductive layer 146 is formed over encapsulant 150 and back surface 128 of semiconductor die using substrate 140. The build-up interconnect structure 154 is electrically connected to conductive layer 146. By forming conductive layer 146 within cavities 142, e.g., over back surface 128 of semiconductor die 124, and over surface 143 of substrate 140 outside the cavities, a vertical and horizontal electrical interconnect can be achieved for Fo-WLCSP 164.

Figure 6:
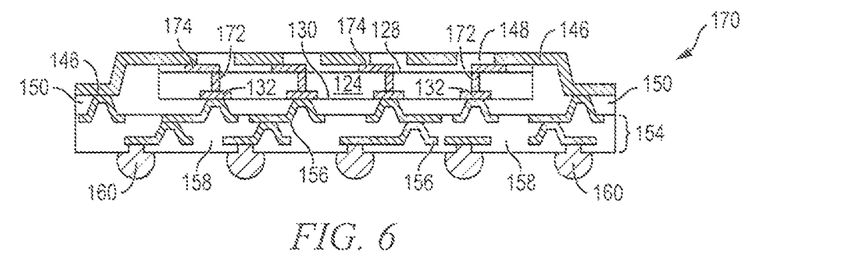
FIG. 6 illustrates a Fo-WLCSP with conductive TSV and a conductive layer formed over a metal substrate for vertical and horizontal electrical interconnect.

FIG. 6 shows an embodiment of Fo-WLCSP 170, similar to FIG. 5, with conductive vias 172 formed through semiconductor die 124. A plurality of vias is formed through semiconductor die 124 at the wafer level, see FIGS. 3a-3b, using mechanical drilling, laser drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form z-direction conductive through silicon vias (TSV) 172. Conductive TSV 172 can be electrically connected to conductive layer 146 with conductive layer or conductive paste 174.

Semiconductor die 124 is electrically connected to build-up interconnect structure 154 and bumps 160. A conductive layer 146 is formed over encapsulant 150 and back surface 128 of semiconductor die using substrate 140. By forming conductive layer 146 within cavities 142, e.g., over back surface 128 of semiconductor die 124, and over surface 143 of substrate 140 outside the cavities, a vertical and horizontal electrical interconnect can be achieved for Fo-WLCSP 170. Semiconductor die 124 is electrically connected to conductive layer 146 through conductive TSV 172 to provide additional vertical electrical interconnect for semiconductor die 124.

Figure 7A:
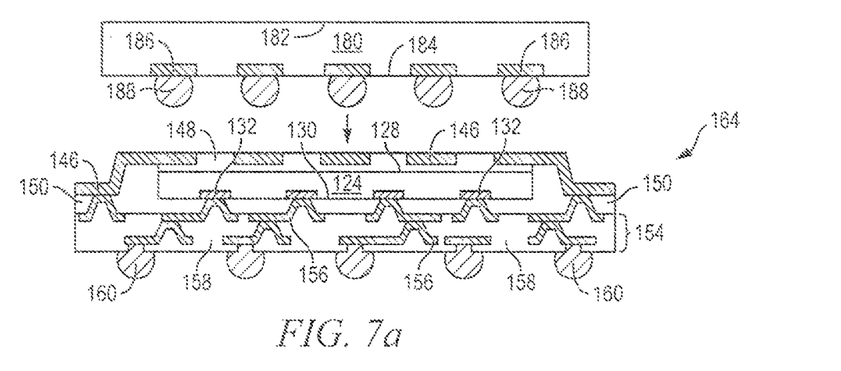
FIGS. 7a-7b illustrate a semiconductor die mounted to the Fo-WLCSP having a conductive layer formed over a metal substrate for vertical and horizontal electrical interconnect.

In FIG. 7a, semiconductor die 180 has a back surface 182 and active surface 184 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 184 to implement analog circuits or digital circuits, such as a DSP, ASIC, memory, or other signal processing circuit. Semiconductor die 124 may also contain IPDs, such as inductors, capacitors, and resistors, for RF signal processing.

An electrically conductive layer 186 is formed over active surface 184 using PVD, CVD, electrolytic plating, electroless plating process, or other suitable metal deposition process. Conductive layer 186 can be one or more layers of Al, Cu, Sn, Ni, Au, Ag, Ti, W, Pd, Pt, or other suitable electrically conductive material. Conductive layer 186 operates as contact pads electrically connected to the circuits on active surface 184. Conductive layer 186 can be formed as contact pads disposed side-by-side a first distance from the edge of semiconductor die 124. Alternatively, conductive layer 186 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 188. In some applications, bumps 188 are reflowed a second time to improve electrical contact to conductive layer 186. An UBM layer can be formed under bumps 188. Bumps 188 can also be compression bonded to conductive layer 186. Bumps 188 represent one type of interconnect structure that can be formed over conductive layer 186. The interconnect structure can also use bond wires, stud bump, micro bump, or other electrical interconnect.

Figure 7B:
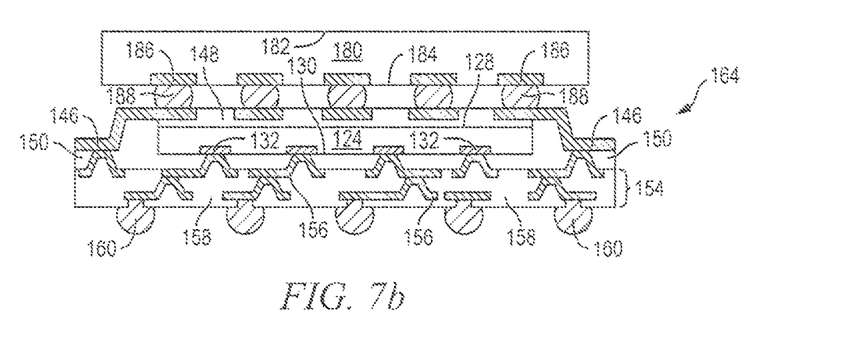

Semiconductor die 180 are positioned over Fo-WLCSP 164 with bumps 188 oriented towards and aligned with conductive layer 146. FIG. 7b shows semiconductor die 180 mounted to Fo-WLCSP 164 with bumps 188 metallurgically and electrically connected to conductive layer 146. Semiconductor die 124 is electrically connected through build-up interconnect structure 154 and conductive layer 146 to semiconductor die 180. The build-up interconnect structure 154 is electrically connected to conductive layer 146. By forming conductive layer 146 within cavities 142, e.g., over back surface 128 of semiconductor die 124, and over surface 143 of substrate 140 outside the cavities, a vertical and horizontal electrical interconnect to semiconductor die 180 can be achieved for Fo-WLCSP 164.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a cavity;
   forming a contact pad within the cavity;
   disposing a first semiconductor die within the cavity with the contact pad between the semiconductor die and substrate;
   disposing a first insulating layer between the first semiconductor die and substrate and covering the contact pad;
   depositing an encapsulant over the first semiconductor die and substrate;
   forming an interconnect structure over the encapsulant and electrically connected to the first semiconductor die and contact pad; and
   removing the substrate to expose the contact pad from the first insulating layer for electrical interconnect.

2. The method of claim 1, further including forming a plurality of indentations in a surface of the substrate opposite the cavity.

3. The method of claim 1, wherein forming the interconnect structure includes:
   forming a conductive layer; and
   forming a second insulating layer over the conductive layer.

4. The method of claim 1, further including forming a plurality of conductive vias through the first semiconductor die.

5. The method of claim 1, further including disposing a second semiconductor die over the contact pad opposite the first semiconductor die.

6. The method of claim 1, further including removing a portion of the encapsulant by direct laser ablation to expose the first semiconductor die.

7. A method of making a semiconductor device, comprising:
   providing a substrate including a cavity;
   forming a contact pad within the cavity;
   disposing a first semiconductor die within the cavity with the contact pad between the semiconductor die and substrate;
   depositing an encapsulant over the first semiconductor die and substrate;
   forming an interconnect structure over the encapsulant and electrically connected to the first semiconductor die and contact pad; and
   removing the substrate to expose the contact pad.

8. The method of claim 7, further including disposing an insulating layer between the first semiconductor die and substrate with the contact pad embedded within the insulating layer.

9. The method of claim 7, further including forming an indentation in a surface of the substrate opposite the cavity.

10. The method of claim 7, further including forming a conductive via through the first semiconductor die.

11. The method of claim 7, further including disposing a second semiconductor die over the contact pad opposite the first semiconductor die.

12. The method of claim 7, wherein forming the interconnect structure includes:
    forming a conductive layer; and
    forming an insulating layer over the conductive layer.

13. The method of claim 7, further including removing a portion of the encapsulant by direct laser ablation to expose the first semiconductor die.

14. A method of making a semiconductor device, comprising:
    providing a substrate including a cavity;
    forming a first conductive layer including a conductive trace and contact pad within the cavity of the substrate;
    disposing a first semiconductor die within the cavity over the first conductive layer;

forming an interconnect structure over the first semiconductor die; and removing the substrate to expose the first conductive layer for electrical interconnect.

15. The method of claim 14, further including depositing an encapsulant over the first semiconductor die and substrate.

16. The method of claim 14, further including disposing an insulating layer between the first semiconductor die and substrate with the first conductive layer embedded within the insulating layer.

17. The method of claim 14, further including forming an indentation in a surface of the substrate.

18. The method of claim 14, further including forming a conductive via through the first semiconductor die.

19. The method of claim 14, further including disposing a second semiconductor die over the conductive layer opposite the first semiconductor die.

20. A semiconductor device, comprising:
a substrate including an opening in the substrate;
a first conductive layer including a conductive trace and contact pad formed over the substrate and into the opening in the substrate;
a first semiconductor die disposed within the opening in the substrate over the first conductive layer;
an encapsulant deposited over the first semiconductor die and substrate; and
an interconnect structure formed over the encapsulant and electrically connected to the first semiconductor die and first conductive layer.

21. The semiconductor device of claim 20, further including an insulating layer disposed between the first semiconductor die and substrate with the first conductive layer embedded within the insulating layer.

22. The semiconductor device of claim 20, further including a plurality of indentations formed in a surface of the substrate.

23. The semiconductor device of claim 20, further including a conductive via formed through the first semiconductor die.

24. The semiconductor device of claim 20, further including a second semiconductor die disposed over the first conductive layer opposite the first semiconductor die.

25. The semiconductor device of claim 20, wherein the interconnect structure includes:
a second conductive layer; and
an insulating layer formed over the second conductive layer.

* * * * *